United States Patent
Kim et al.

(10) Patent No.: US 11,332,372 B2
(45) Date of Patent: May 17, 2022

(54) APPARATUS FOR CONTINUOUSLY PRODUCING CARBON NANOTUBES

(71) Applicant: KOREA INSTITUTE OF SCIENCE AND TECHNOLOGY, Seoul (KR)

(72) Inventors: Seung Min Kim, Jeollabuk-do (KR); Sung Hyun Lee, Jeollabuk-do (KR); Jun Beom Park, Jeollabuk-do (KR); Ji Hong Park, Jeollabuk-do (KR); Dong Myeong Lee, Jeollabuk-do (KR); Sook Young Moon, Jeollabuk-do (KR); Hyeon Su Jeong, Jeollabuk-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 21 days.

(21) Appl. No.: 16/923,092

(22) Filed: Jul. 8, 2020

(65) Prior Publication Data
US 2021/0188643 A1    Jun. 24, 2021

(30) Foreign Application Priority Data
Dec. 19, 2019 (KR) .......... 10-2019-0170412

(51) Int. Cl.
*C01B 32/164* (2017.01)
*C01B 32/162* (2017.01)
(Continued)

(52) U.S. Cl.
CPC .......... *C01B 32/164* (2017.08); *C01B 32/162* (2017.08); *B82Y 30/00* (2013.01); *B82Y 40/00* (2013.01); *C01B 2202/02* (2013.01)

(58) Field of Classification Search
CPC . C01B 32/164; C01B 32/162; C01B 2202/02; C01B 2202/30; C01B 2202/26;
(Continued)

(56) References Cited

U.S. PATENT DOCUMENTS

2009/0117025 A1* 5/2009 Lashmore .............. B82Y 40/00
                                                             423/445 R
2009/0186223 A1* 7/2009 Saito ...................... B82Y 30/00
                                                             428/367
(Continued)

FOREIGN PATENT DOCUMENTS

EP       2025643 A1    2/2009
EP       2465818 A1    6/2012
(Continued)

OTHER PUBLICATIONS

Huang, et al., 99.9% purity multi-walled carbon nanotubes by vacuum high-temperature annealing, Carbon 2003; 41: 2585-2590 (Year: 2003).*
(Continued)

*Primary Examiner* — Daniel C. McCracken
(74) *Attorney, Agent, or Firm* — Cantor Colburn LLP (57) ABSTRACT

The present disclosure provides an apparatus capable of continuously producing carbon nanotubes having high crystallinity, a low residual catalyst content and a high aspect ratio. The apparatus for producing carbon nanotubes includes: a reaction unit configured to synthesize carbon nanotubes (CNTs), a supply unit configured to supply a carbon source to the reaction unit through a supply pipe; and a collection unit configured to collect carbon nanotubes discharged from the reaction unit, wherein the reaction unit may include a chemical vapor deposition reactor.

16 Claims, 11 Drawing Sheets

(51) Int. Cl.
*B82Y 30/00* (2011.01)
*B82Y 40/00* (2011.01)

(58) Field of Classification Search
CPC ..... C01B 32/158; C01B 32/159; C01B 32/16; C01B 32/166; C01B 32/168; C01B 32/17; C01B 32/172; C01B 32/174; C01B 32/176; C01B 32/178; C01B 2202/00; C01B 2202/04; C01B 2202/06; C01B 2202/08; C01B 2202/10; C01B 2202/20; C01B 2202/22; C01B 2202/24; C01B 2202/28; C01B 2202/32; C01B 2202/34; C01B 2202/36; B82Y 30/00; B82Y 40/00; C23C 16/45506; C01P 2004/54; C01P 2002/00; C01P 2006/80; D01F 9/12; D01F 9/127; D01F 9/1271; D01F 9/1272; D01F 9/1273; D01F 9/1274; D01F 9/1275; D01F 9/1276; D01F 9/1277; D01F 9/1278; D01F 9/133; B01J 19/2415
See application file for complete search history.

(56) References Cited

U.S. PATENT DOCUMENTS

| | | | |
|---|---|---|---|
| 2010/0055347 A1* | 3/2010 | Kato | C23C 16/45551 427/569 |
| 2011/0085961 A1* | 4/2011 | Noda | B01J 8/1836 423/447.3 |

FOREIGN PATENT DOCUMENTS

| | | |
|---|---|---|
| EP | 2694435 B1 | 7/2020 |
| KR | 1020070073398 A | 7/2007 |
| KR | 1020080113242 A | 12/2008 |
| KR | 10-2010-0108506 A | 10/2010 |
| KR | 101349678 B1 | 1/2014 |
| KR | 101716584 B1 | 3/2017 |
| KR | 102059224 B1 | 12/2019 |
| WO | 2012138017 A1 | 10/2012 |

OTHER PUBLICATIONS

Dai, et al., Single-wall nanotubes produced by metal-catalyzed disproportionation of carbon monoxide, Chemical Physics Letters 1996; 260: 471-475 (Year: 1996).*

Sato, et al., Growth of diameter-controlled carbon nanotubes using monodisperse nickel nanoparticles obtained with a differential mobility analyzer, Chemical Physics Letters 2003; 382: 361-366 (Year: 2003).*

Ya-Li Li et al. "Direct Spinning of Carbon Nanotube Fibers from Chemical Vapor Deposition Synthesis," Science, Apr. 9, 2004, pp. 276-278, vol. 304.

Han Bin Park, "Continuous synthesis of high-quality carbon nanotubes by floating catalyst chemical vapor deposition method," CHOSUN University, a master's thesis, Feb. 2018, English abstract.

C. Paukner et al., "Ultra-pure single wall carbon nanotube fibres continuously spun without promoter," Scientific Reports, Feb. 2014, 7 pages, vol. 4.

Korean Office Action for KR Application No. 10-2019-0170412 dated Aug. 25, 2021.

* cited by examiner

APPARATUS FOR CONTINUOUSLY PRODUCING CARBON NANOTUBES

CROSS-REFERENCE TO RELATED APPLICATION

This application claims under 35 U.S.C. § 119(a) the benefit of priority to Korean Patent Application No. 10-2019-0170412 filed on Dec. 19, 2019, the entire contents of which are incorporated herein by reference.

BACKGROUND

(a) Technical Field

The present disclosure relates to an apparatus capable of continuously producing carbon nanotubes having high crystallinity, a low residual catalyst content and a high aspect ratio.

(b) Background Art

Carbon nanotubes (CNTs) are one of carbon allotropes with $sp^2$ bonds, and are composed of graphite layers rolled up into cylindrical tubes. These carbon nanotubes are several nm to several tens of nm in diameter, and the length thereof is tens to thousands of times larger than the diameter thereof, and thus carbon nanotubes have a high aspect ratio. In addition, the carbon nanotubes exhibit conductive or semiconductive properties depending on their chirality, are thermally stable, and have high strength due to the strong covalent bonds between carbon atoms. By virtue of these properties, carbon nanotubes are applicable across a wide range of industries.

Processes for synthesis of carbon nanotubes include an arc-discharge process, a laser ablation process, a chemical vapor deposition (CVD) process, etc.

The chemical vapor deposition process is a method of growing carbon nanotubes by reacting a reaction gas (carbon-containing gas) with an introduced catalyst in a high-temperature reaction tube. That is, the catalyst and the reaction gas are introduced into the reaction tube and react during passage through the reaction tube, whereby carbon nanotubes grow. Finally, the synthesized carbon nanotubes are discharged from the reaction tube.

SUMMARY OF THE DISCLOSURE

The present disclosure has been made in an effort to solve the above-described problems associated with the prior art.

An object of the present disclosure is to provide an apparatus capable of producing carbon nanotubes at high yield.

Another object of the present disclosure is to provide an apparatus for producing carbon nanotubes in which the amount of residual catalyst is very small so that post-treatment for removal of the residual catalyst is not required.

Still another object of the present disclosure is to provide an apparatus capable of producing carbon nanotubes having very high crystallinity.

Yet another object of the present disclosure is to provide an apparatus capable of producing carbon nanotubes having a very high aspect ratio.

The objects of the present disclosure are not limited to the objects mentioned above. The objects of the present disclosure will be more apparent from the following description, and are achieved by the means described in the claims and combinations thereof.

In one aspect, the present disclosure provides an apparatus for producing carbon nanotubes including: a reaction unit in which carbon nanotubes (CNTs) are synthesized; a supply unit configured to supply a carbon source to the reaction unit through a supply pipe; and a collection unit configured to collect carbon nanotubes discharged from the reaction unit, wherein the reaction unit may include a chemical vapor deposition reactor.

In a preferred embodiment, the supply unit may include: a first supply pipe for supplying the carbon source; a second supply pipe for supplying a catalyst; and a third supply pipe for introducing a reaction gas, supplied from the first supply pipe and the second pipe, into the reaction unit.

In a preferred embodiment, the reaction unit may include: a nozzle member communicating with the supply pipe; a reaction tube into one end of which the nozzle member is inserted, the reaction tube being formed to have a predetermined length along the insertion direction of the nozzle and providing a space in which the carbon nanotubes are synthesized from the carbon source supplied through the nozzle member; and a chamber formed to have a predetermined length outside the reaction tube and configured to supply heat to the reaction tube to form a reaction area within the reaction tube.

In a preferred embodiment, the distance between the end of the nozzle member that is inserted into the reaction tube and the reaction area may be 30 mm to 80 mm.

In a preferred embodiment, the nozzle member may be inserted into the reaction tube to a depth of 250 mm to 300 mm.

In a preferred embodiment, the temperature of the end of the nozzle member may be 850° C. to 1,000° C. when the temperature of the reaction area is adjusted to 1,100° C. to 1,300° C.

In a preferred embodiment, the nozzle member may have an inner diameter of 2 mm to 7 mm.

In a preferred embodiment, the nozzle member may include an alumina tube.

In a preferred embodiment, the reaction tube may include a horizontal reaction tube.

In a preferred embodiment, the chamber may include: a housing including a heat insulating material; a partition dividing the interior space of the housing into a plurality of spaces; and a heating member provided in the plurality of spaces and configured to apply heat to the reaction tube.

In a preferred embodiment, the apparatus may further include a cooling member provided outside the one end of the reaction tube, in which the nozzle member is inserted, the cooling member being configured to cool the heat generated from the carbon source flowing through the nozzle member.

In a preferred embodiment, the reaction unit may further include a heating tape provided between the cooling member and the chamber outside the reaction tube.

In a preferred embodiment, the collection unit may include a filter member connected to the reaction unit and configured to collect the synthesized carbon nanotubes discharged from the reaction unit while allowing unreacted material to pass therethrough.

In another preferred embodiment, the apparatus for producing carbon nanotubes may be one in which a plurality of nozzle members is inserted into the reaction tube.

The production apparatus may be one in which a plurality of nozzle members is inserted by individually adjusting the insertion length of each of the nozzle members or the distance between the end of each nozzle member and the reaction area.

BRIEF DESCRIPTION OF THE DRAWINGS

The above and other features of the present disclosure will now be described in detail with reference to certain exemplary embodiments thereof, illustrated in the accompanying drawings, which are given hereinbelow by way of illustration only, and thus are not limitative of the present disclosure, and wherein:

FIG. 6C shows the results of measuring the aspect ratios of carbon nanotubes produced in Examples 1 and 2, based on the Onsager theory, by which the aspect ratio of carbon nanotubes has an inverse relationship with the phase transition temperature;

DETAILED DESCRIPTION

The above objects, other objects, features and advantages of the present disclosure will be better understood from the following description of preferred embodiments taken in conjunction with the accompanying drawings. The present disclosure may, however, be embodied in different forms, and should not be construed as being limited to the embodiments set forth herein. Rather, the embodiments disclosed herein are provided so that this disclosure will be thorough and complete and will fully convey the scope of the present disclosure to those skilled in the art.

Unless otherwise noted, like reference numbers refer to like elements throughout the attached drawings and the detailed description. In the accompanying drawings, the dimensions of structures are exaggerated for clarity of illustration. Although the terms "first", "second", etc. may be used herein to describe various elements or components, these elements or components should not be limited by these terms. These terms are only used to distinguish one element or component from another element or component. For example, a first element or component could be termed a second element or component and vice versa without departing from the scope of the present disclosure. As used herein, the singular forms are intended to include the plural forms as well, unless the context clearly indicates otherwise.

The terms "include," "comprise," "including," "comprising," "have", "having", etc. specify the presence of stated features, numbers, steps, operations, elements, parts or combinations thereof, but do not preclude the presence or addition of one or more other features, numbers, steps, operations, elements, parts or combinations thereof. In addition, it will be understood that when an element such as a layer, film, region, or substrate is referred to as being "on" another element, it can be directly on the other element, or intervening elements may also be present. Further, it will be understood that when an element such as a layer, film, region, or substrate is referred to as being "under" another element, it can be directly under the other element, or intervening elements may also be present.

In addition, it is to be understood that, when an element is referred to as being "connected" or "coupled" to another element, it can be connected or coupled directly to the other element, or intervening elements may be present.

Since all numbers, values and/or expressions referring to quantities of ingredients, reaction conditions, polymer compositions, formulations, etc., used herein are subject to various uncertainties of measurement encountered in obtaining such values, unless otherwise indicated, all expressions pertaining thereto are to be understood as being modified in all instances by the term "about." Where a numerical range is disclosed herein, such range is continuous, inclusive of both the minimum and maximum values of the range as well as every value between such minimum and maximum values. Still further, where a range refers to integers, every integer between the minimum and maximum values of the range is included.

Figure 1:
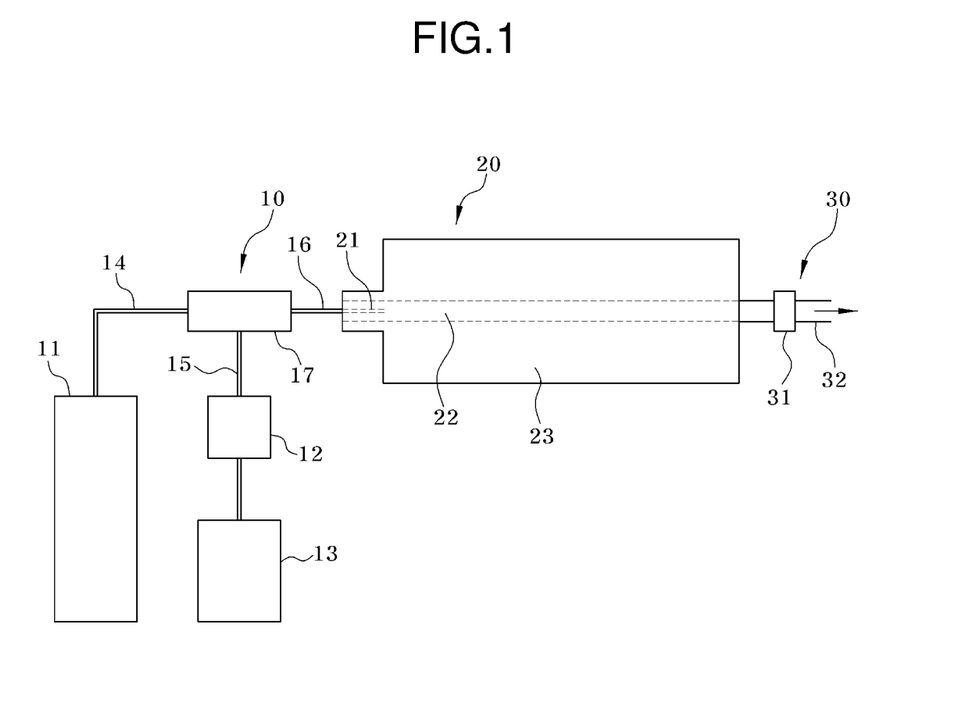
FIG. 1 schematically illustrates an apparatus for producing carbon nanotubes according to the present disclosure.

FIG. 1 schematically illustrates an apparatus for producing carbon nanotubes according to the present disclosure. Referring to FIG. 1, the apparatus includes: a reaction unit 20 in which carbon nanotubes (CNTs) are synthesized; a supply unit 10 configured to supply a carbon source to the reaction unit 20 through supply pipes 14, 15 and 16; and a collection unit 30 configured to collect carbon nanotubes discharged from the reaction unit 20. In particular, the reaction unit 20 may be a chemical vapor deposition reactor.

Hereinafter, each component of the apparatus will be described in detail.

The supply unit 10 may include supply pipes 14, 15 and 16 connected to one another so that a carbon source 11, a catalyst 12 and a carrier gas may be supplied to the reaction unit 20. The supply unit 10 may include a separate carrier gas supply line (not shown) which is not connected to the supply pipes for supplying the carbon source 11 and the catalyst 12.

The carbon source 11 is a material for synthesizing carbon nanotubes, and may be a carbon-containing gas or a storage tank storing the same. The carbon-containing gas is not particularly limited, and may include, for example, carbon monoxide (CO).

The catalyst 12 serves to promote the reaction in which the carbon nanotubes are synthesized from the carbon source 11. The catalyst 12 may be a metal catalyst, a non-metal catalyst, or a precursor thereof. Here, the catalyst 12 may also refer to a storage tank storing the metal catalyst, non-metal catalyst, or precursor thereof.

The metal catalyst may include a transition metal such as iron (Fe), nickel (Ni), cobalt (Co) or the like. The precursor of the metal catalyst may include iron pentacarbonyl (Fe $(CO)_5$), ferrocene or the like.

The non-metal catalyst may include contain sulfur (S). The precursor of the non-metal catalyst may include thiophene.

The catalyst 12 may be one in which the above-described material having catalytic activity is loaded on a support such as alumina, zeolite or silica.

The catalyst 12 may be a liquid or solid material. Thus, a carrier gas 13 may be used to introduce the catalyst 12 into the reaction unit 20. At this time, the temperature of the catalyst 12 may be adjusted so that the catalyst 12 is supplied in suitable amounts. Means for adjusting the temperature of the catalyst 12 are not particularly limited, and may include a sensor and a heater, which are provided in a tank storing the catalyst 12. The term "carrier gas 13" may also refer to a storage tank storing the carrier gas. The carrier gas is not particularly limited, and may be, for example, nitrogen ($N_2$), hydrogen ($H_2$), or a mixture thereof.

The supply unit 10 may further include a mixing member 17 configured to prepare a reaction gas by mixing the carbon source 11, the catalyst 12 and the carrier gas 13 and to supply the reaction gas to the reaction unit 20.

Specifically, the carbon source 11 and the catalyst may be introduced into the mixing member 17 through the first supply pipe 14 and the second supply pipe 15, respectively. At this time, the catalyst 12 may be moved by the carrier gas 13 via the second supply 15 into the mixing member 17. The carbon source 11 and the catalyst 12 introduced in the mixing member 17 are mixed with each other to form a reaction gas which is then introduced into the reaction unit 20 through the third supply pipe 16.

Figure 2:
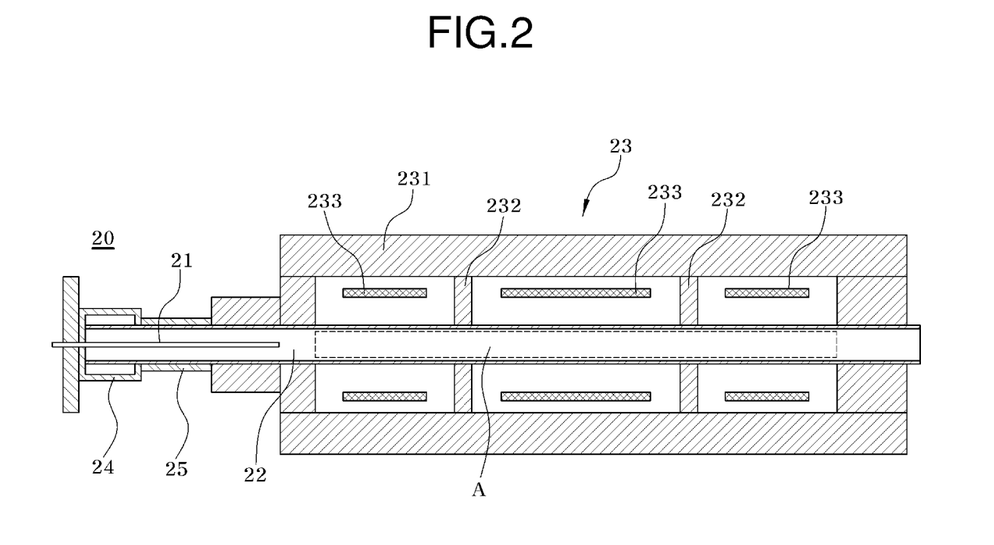
FIG. 2 is a sectional view illustrating a reaction unit included in the apparatus for producing carbon nanotubes according to the present disclosure.

FIG. 2 is a sectional view illustrating the reaction unit 20 included in the apparatus for producing carbon nanotubes according to the present disclosure. Referring to FIG. 2, the reaction unit 20 may include: a nozzle member 21 communicating with the supply pipe, specifically the third supply pipe 16; a reaction tube 22 into one end of which the nozzle member 21 is inserted, the reaction tube being formed to have a predetermined length along the insertion direction of the nozzle member 21 and providing a space in which carbon nanotubes are synthesized from the carbon source supplied from the nozzle member 21; and a chamber 23 formed to have a predetermined length outside the reaction tube 22 and configured to supply heat to the reaction tube 22 to form a reaction area A within the reaction tube 22.

The reaction tube 22 may be a horizontal reaction tube 22. Specifically, the central axis of the reaction tube 22 may be disposed parallel to or approximately parallel to the ground. According to one technical feature of the present disclosure, the horizontal reaction tube 22 is adopted, unlike a conventional vertical reactor, so that the reaction area and the residence time of the reaction gas in the reaction tube 22 are easily adjusted, thus increasing the yield of carbon nanotubes.

The chamber 23 may include: a housing 231 including a heat insulating material; a partition 232 dividing the interior space of the housing 231 into a plurality of spaces; and a heating member 233 provided in the plurality of spaces and configured to apply heat to the reaction tube 22.

Because the plurality of heating members 233 is provided along the reaction tube 22, the temperature in the reaction tube 22 may be appropriately adjusted for each section. The type of heating member 233 is not particularly limited, and, for example, an electric furnace (resistance heating furnace) may be used as the heating member 233.

When heat is transferred from the heating member 233 to the reaction tube 22, a reaction area A may be formed within the reaction tube 22. Here, the reaction area A is a space heated to a predetermined temperature or higher, which is a space in which carbon nanotubes are synthesized from a reaction gas including the carbon source 11 and the catalyst 12, which is introduced into the reaction tube 22. Although the reaction area A is not exactly defined, it refers herein to a space inside the reaction tube 22 to which heat transferred from the heating member 233 reaches. Since the housing 231 is made of a heat insulating member, a boundary line at which the reaction tube 22 and the ends of the inner surface of the housing 231 abut will be a virtual line defining the reaction area A.

The reaction unit 20 may further include a cooling member 24 provided outside one end of the reaction tube into which the nozzle member 21 is inserted, the cooling member 24 being configured to cool heat generated from the reaction gas including the carbon source 11 and the catalyst 12, which flows along the nozzle member 21. The type of cooling member 24 is not particularly limited, and may be, for example, a device using cooling water.

In addition, the reaction unit 20 may further include a heating tape 25 provided between the cooling member 24 and the chamber 23 outside the reaction tube 22. The heating tape 25 is configured to prevent the reaction tube 22 from being exposed to the outside.

The present disclosure is technically characterized in that the distance between the nozzle member 21 and the reaction area A is adjusted to increase the yield, crystallinity, aspect ratio and purity of carbon nanotubes. This will be described in detail based on Examples below.

Figure 3:
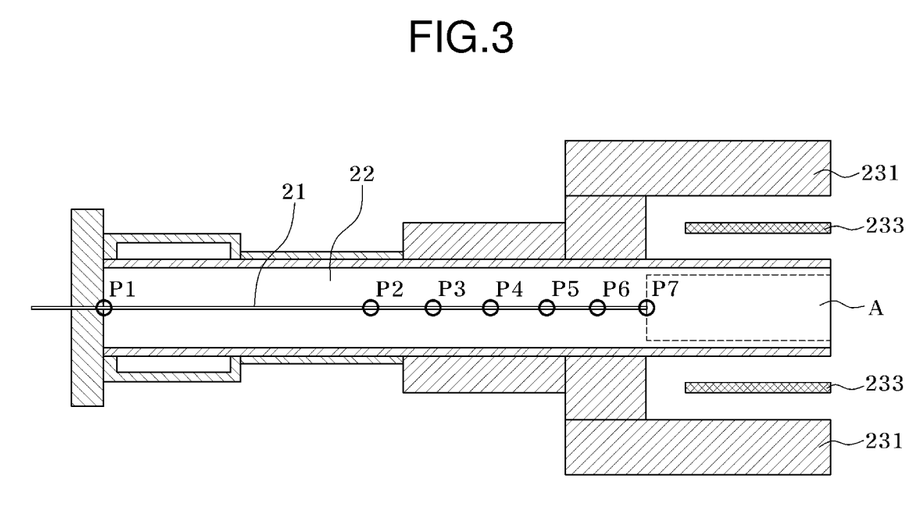
FIG. 3 is a reference view illustrating Examples of the present disclosure and Comparative Examples.

FIG. 3 is a reference view illustrating an Example of the present disclosure and a Comparative Example. Specifically, FIG. 3 is an enlarged view of a portion in which the nozzle member 21 is inserted into the reaction tube 22.

First, the nozzle member 21 was inserted into the reaction tube 22 so that the ends thereof were located at P1 to P7, respectively, thereby achieving the reaction unit 20. In addition, as the nozzle member 21, an alumina tube having an inner diameter of about 4 mm was used. All other conditions, for example, the types of the carbon source and the catalyst and the flow rate of the reaction gas, were all the same between the Examples and the Comparative Examples.

The insertion length of the nozzle member 21 according to each position, the distance between the end of the nozzle member 21 and the reaction area A, and the temperature at each point are shown in Table 1 below.

TABLE 1

| Items | Comparative Example 1 | Comparative Example 2 | Comparative Example 3 | Comparative Example 4 | Example 1 | Example 2 | Example 5 |
|---|---|---|---|---|---|---|---|
| Position | P1 | P2 | P3 | P4 | P5 | P6 | P7 |
| Insertion length of | 0 | 160 | 200 | 250 | 270 | 300 | 330 |

TABLE 1-continued

| Items | Comparative Example 1 | Comparative Example 2 | Comparative Example 3 | Comparative Example 4 | Example 1 | Example 2 | Example 5 |
|---|---|---|---|---|---|---|---|
| nozzle member [mm] Distance between nozzle member and reaction area [mm] | 330 | 170 | 130 | 80 | 60 | 30 | 0 |
| Temperature[1)][° C.] | 93 | 450 | 615 | 789 | 877 | 967 | 1,046 |

[1)]The temperature means the temperature at the end of the nozzle member 21 when the temperature of the reaction area is set to be about 1,200° C.. The temperature values shown are averages of the temperatures, measured 10 times at each point.

Using the production apparatuses configured as described above, carbon nanotubes were synthesized.

Figure 4A:
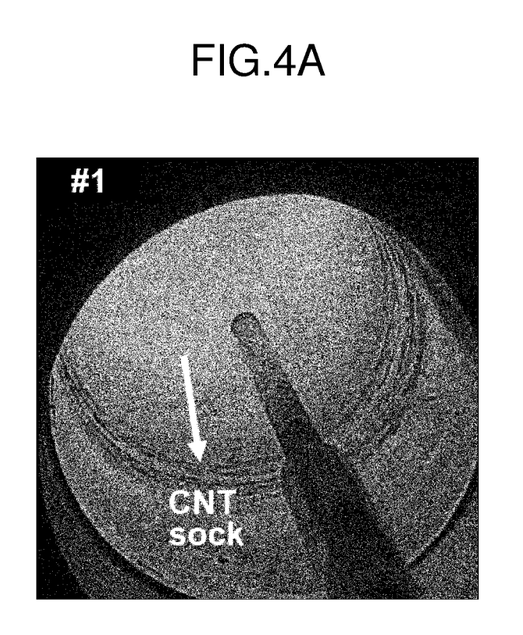
FIGS. 4A and 4B are photographs of products collected on collection units in the apparatuses of Comparative Example 1 and Example 1, respectively.
Figure 4B:
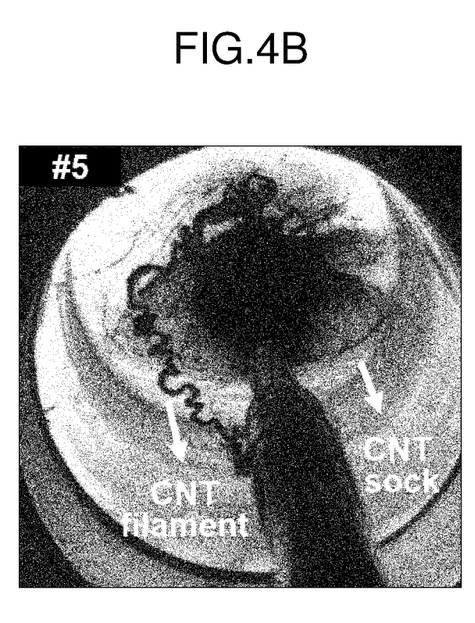

FIGS. 4A and 4B are photographs of reaction products collected in the collection units in the production apparatuses according to Comparative Example 1 and Example 1. Referring thereto, it can be seen that in Example 1, carbon nanotube filaments were formed to a very long length. In contrast, in Comparative Example 1, no filaments were formed.

Figure 5A:
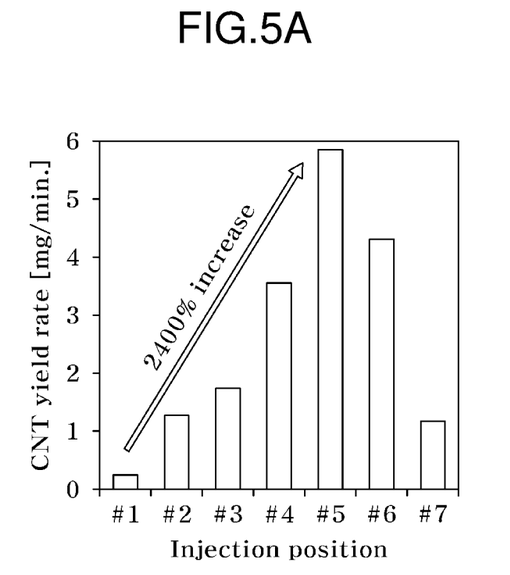
FIG. 5A shows the results of measuring the yields of carbon nanotubes (CNTs) produced using the production apparatuses of Examples and Comparative Examples.

FIG. 5A shows the results of measuring the yields of carbon nanotubes produced using the production apparatuses according to the Examples and the Comparative Examples. Referring to FIG. 5A, it can be seen that when the production apparatus according to Example 1 was used, the yield of carbon nanotubes increased by about 2400% compared to when the production apparatus according to Comparative Example 1 was used.

Figure 5B:
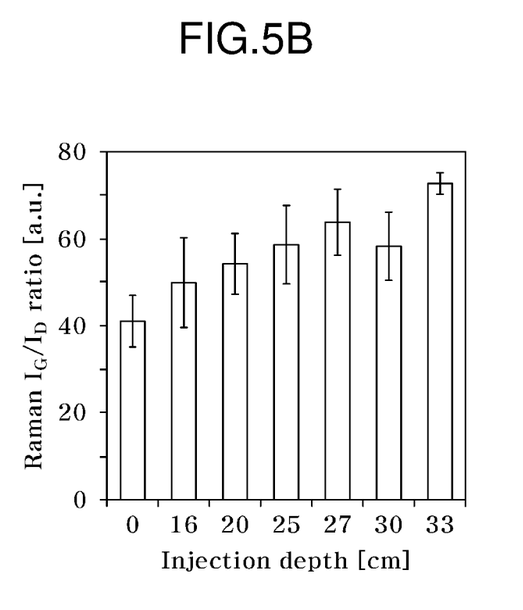
FIG. 5B shows the results of measuring the crystallinities of carbon nanotubes (CNTs) produced using the production apparatuses of the Examples and the Comparative Examples.

FIG. 5B shows the results of measuring the crystallinities of carbon nanotubes produced using the production apparatuses according to the Examples and the Comparative Examples. Specifically, FIG. 5B shows the results of measuring the G-band/D-band intensity ratio ($I_G/I_D$) in the Raman spectrum of each carbon nanotube. For reference, the G band in the Raman spectrum is a vibration mode observed at around 1590 $cm^{-1}$, and the D band is a vibration mode observed at around 1350 $cm^{-1}$. The intensity ratio ($I_G/I_D$) of peaks derived from the G band and the D band has high objectivity as a measure of the structure or purity of a single-walled carbon nanotube, and is known to be one of the most reliable purity evaluation methods. It is considered that a higher $I_G/I_D$ value indicates higher purity and higher quality. Referring to the results of Example 1 (#5) and Example 2 (#6), it can be seen that the intensity ratios ($I_G/I_D$) of the peaks were all higher than 50, indicating that carbon nanotubes having high purity and high crystallinity were produced in Examples 1 and 2.

Figure 5C:
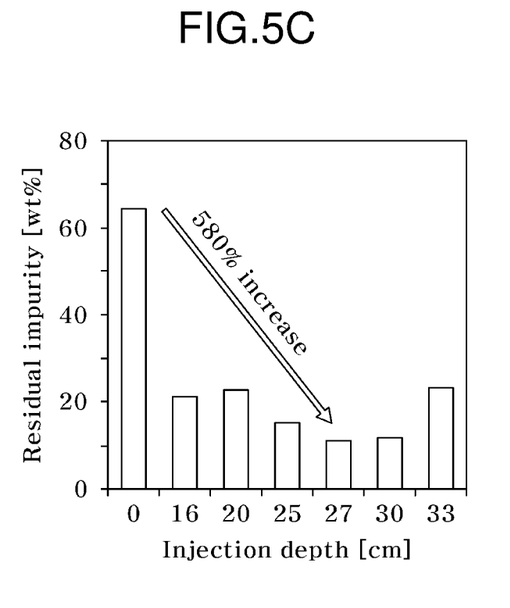
FIG. 5C shows the results of measuring the contents of residual impurities in carbon nanotubes (CNTs) produced using the production apparatuses of the Examples and the Comparative Examples.

FIG. 5C shows the results of measuring the residual impurity content of carbon nanotubes produced using the production apparatuses according to the Examples and the Comparative Examples. Referring to FIG. 5C, it can be seen that the carbon nanotubes obtained in Examples 1 and 2 have a very low impurity (i.e., residual catalyst) content of less than 10%.

Figure 6A:
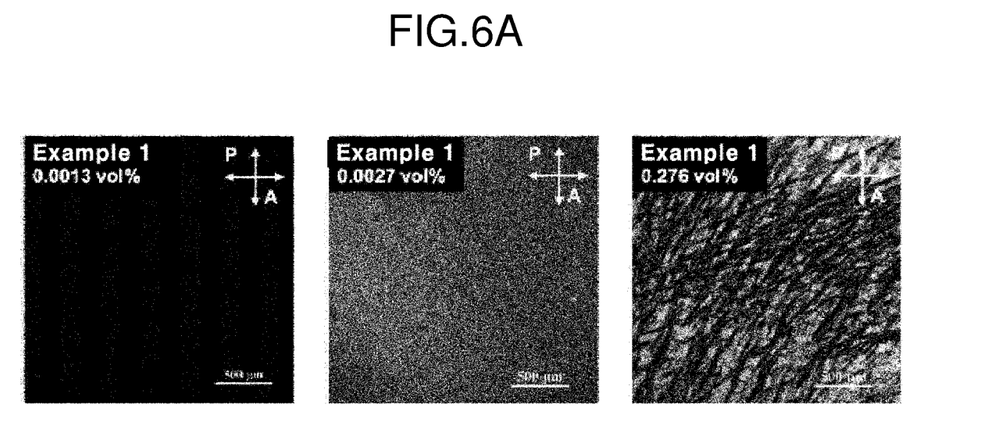
FIGS. 6A and 6B show the results of measuring the concentration at which a biphasic region appears, in which the isotropic and nematic phases coexist, after dispersing the carbon nanotubes produced in Examples 1 and 2, respectively, in superacid in order to measure the aspect ratios of the carbon nanotubes.
Figure 6B:
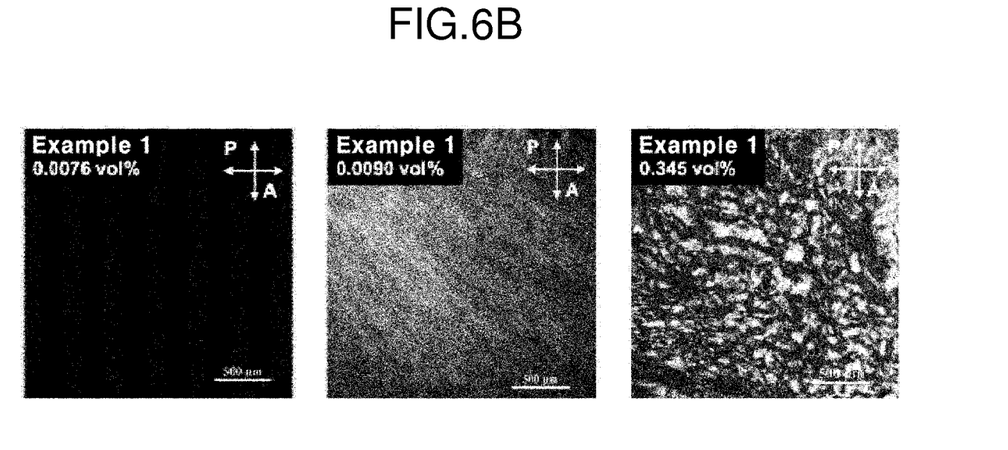

FIGS. 6A and 6B show the results obtained by dissolving the carbon nanotubes, produced in Examples 1 and 2, respectively, in chlorosulfonic acid (which is a superacid) in order to measure the aspect ratios of the carbon nanotubes, and then measuring the concentration at which transition of each of the solutions to a biphasic region (in which the isotropic and nematic phases coexist) appears, while adjusting the concentration of the carbon nanotubes in each of the solutions. As shown therein, phase transition of the carbon nanotubes produced in Example 1 occurred when the concentration of the carbon nanotubes in the superacid was about 0.0021% by volume, and phase transition of the carbon nanotubes produced in Example 2 occurred when the concentration of the carbon nanotubes in the superacid was about 0.0083% by volume.

Figure 7:
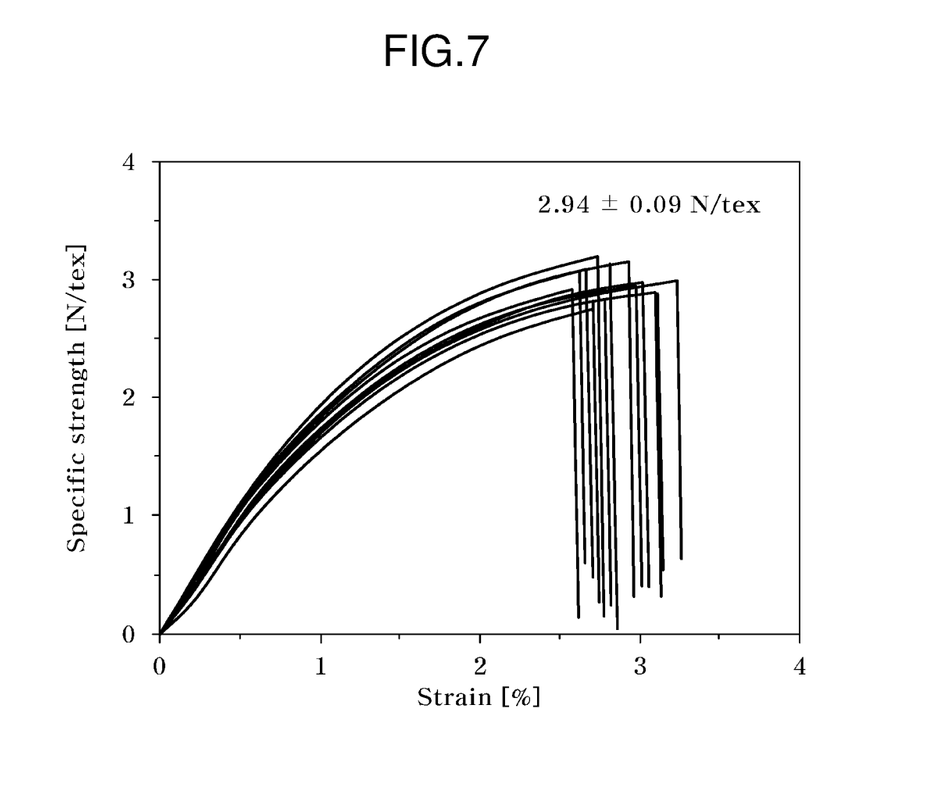
FIG. 7 shows the results of measuring the specific tensile strength of carbon nanotube fibers produced by dispersing the carbon nanotubes produced in Example 1 in superacid and wet-spinning the dispersion.

FIG. 6c is a graph showing the results of measuring the aspect ratio of the carbon nanotubes, produced in each of Examples 1 and 2, based on the Onsager theory whereby the aspect ratio of carbon nanotubes has an inverse relationship with the phase transition temperature. The aspect ratios of the carbon nanotubes of Examples 1 and 2, measured based on this theory, are at least 17,000 and 4,800, respectively. Among the aspect ratios of superacid-dispersible (very highly crystalline) commercial carbon nanotubes introduced in the existing literature, the highest aspect ratio is 9,610. However, commercial carbon nanotubes cannot be fiberized by wet spinning due to their insufficient synthesis, and among the largest aspect ratios of carbon nanotubes that could be fiberized through wet spinning, the highest aspect ratio was 4,400. Therefore, it can be seen that the carbon nanotubes of Examples 1 and 2 have a very high aspect ratio while having very high crystallinity. FIG. 7 shows the results of measuring the specific tensile strength of carbon nanotube fibers produced by dispersing, in superacid, carbon nanotubes having an aspect ratio of 17,000 or higher, produced in Example 1, and wet-spinning the dispersion. In the wet-spinning process, the concentration of the carbon nanotubes dispersed in the superacid was about 5 mg/ml, and the winding speed was about 5.0 m/min. The produced carbon nanotube fibers were washed with water, and were then heat-treated at a temperature of 600° C. under an argon atmosphere for about 1 hour to additionally remove the superacid, and then the specific tensile strength of the carbon nanotube fiber was measured. Referring to FIG. 7, the highest specific tensile strength of the carbon nanotube fibers according to Example 1 was measured to be about 3.00 N/tex or more, and the average specific tensile strength thereof was measured to be about 2.94 N/tex. According to reports to date, the largest aspect ratio of carbon nanotubes capable of being wet-spun using a superacid is 4,400, and the highest specific tensile strength of carbon nanotube fibers produced by dissolving these carbon nanotubes and wet-spinning the solution is about 1.55 N/tex, it can be seen that the carbon nanotube according to the present disclosure has a very high aspect ratio and that the specific strength of the carbon nanotube fiber obtained by wet spinning is excellent. Considering this, it can be seen that the carbon nanotubes according to the present disclosure have a very high aspect ratio, and the specific tensile strength of carbon nanotube fibers obtained by wet-spinning of the carbon nanotubes is excellent.

In summary, it can be seen that when the production apparatus according to the present disclosure is used, carbon nanotubes can be synthesized at high yield, and the purity, crystallinity and specific strength of the carbon nanotubes can be greatly improved.

The characteristic features of the production apparatus according to the present disclosure are as follows.

In the production apparatus, the distance between the end of the nozzle member 21 that is inserted into the reaction tube 22 and the reaction area A may be 30 mm to 60 mm. In addition, in the production apparatus, the nozzle member 21 may be inserted into the reaction tube 22 to a depth of 270 mm to 300 mm. In the case of the Comparative Examples, in which the position of the nozzle member 21 is outside the numerical range, it can be seen through the above-described experimental examples that the yield, purity, crystallinity, etc. of the carbon nanotubes of the Comparative Examples are inferior to those of the Examples.

The production apparatus according to the present disclosure is characterized in that the nozzle member 21 is inserted into the reaction tube 22 to an appropriate depth. Specifically, the end of the nozzle member 21 may be inserted into the reaction tube 22 to a predetermined distance from one end of the reaction tube 22 so that the end may be located in a space where a laminar flow is formed in the reaction tube 22. Since a turbulent flow occurs in the vicinity of the inlet of the reaction tube 22, the nozzle member 21 may be inserted into a space where a stable laminar flow is formed. However, the insertion position of the nozzle member 21 can be adjusted so as not to be too close to the reaction area A, to which heat is directly applied. In this case, when the temperature of the reaction area A in the production apparatus is adjusted to 1,100° C. to 1,300° C., the temperature at the end of the nozzle member 21 may be 850° C. to 1,000° C.

The nozzle member 21 may be an alumina tube having an inner diameter of 2 mm to 7 mm, but is not limited thereto, and a SUS tube, for example, may be used as the nozzle member 21.

Figure 8:
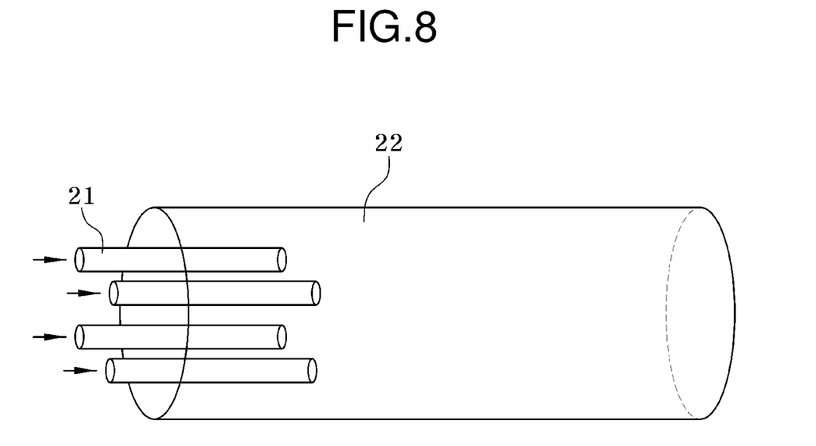
FIG. 8 schematically illustrates another embodiment of the present disclosure.

FIG. 8 schematically illustrates another embodiment of the present disclosure. The production apparatus shown in FIG. 8 can be very advantageous for large-scale equipment. Referring to FIG. 8, the production apparatus according to another embodiment of the present disclosure may be one in which a plurality of nozzle members 21 is inserted into the reaction tube 22. In addition, each of the nozzle members 21 may be inserted by individually adjusting the insertion length thereof and/or the distance between the end thereof and the reaction area A.

The collection unit 30 may include a filter member 31, connected to the reaction unit 20, specifically the reaction tube 22, and configured to collect carbon nanotubes discharged from the reaction unit 20. Unreacted material that has passed through the filter member 31 may be exhausted through the discharge pipe 32 connected to the filter member 31. The unreacted material may be discharged to the outside, or may also be collected again, filtered, and then circulated to the reaction unit 20.

As described above, when the apparatus for producing carbon nanotubes according to the present disclosure is used, the yield of carbon nanotubes can be greatly improved.

In addition, when the apparatus for producing carbon nanotubes according to the present disclosure is used, carbon nanotubes having a very low residual catalyst content can be obtained.

In addition, when the apparatus for producing carbon nanotubes according to the present disclosure is used, carbon nanotubes having very high crystallinity can be obtained.

In addition, when the apparatus for producing carbon nanotubes according to the present disclosure is used, carbon nanotubes having a very high aspect ratio can be obtained.

The effects of the present disclosure are not limited to the above-mentioned effects. It should be understood that the effects of the present disclosure include all effects that can be deduced from the above description.

Although the embodiments of the present disclosure have been described in detail above, the scope of the present disclosure is not limited to the above-described embodiments, and those skilled in the art will appreciate that various modifications and improvements using the basic concepts of the present disclosure as defined in the appended claims also fall within the scope of the present disclosure.

What is claimed is:

1. An apparatus for producing carbon nanotubes comprising:
 a reaction unit in which carbon nanotubes (CNTs) are synthesized;
 a supply unit configured to supply a carbon source to the reaction unit through a supply pipe; and
 a collection unit configured to collect carbon nanotubes discharged from the reaction unit,
 wherein the reaction unit comprises a chemical vapor deposition reactor,
 wherein the reaction unit comprises:
  a nozzle member communicating with the supply pipe;
  a reaction tube, into one end of which the nozzle member is inserted, the reaction tube being formed to have a predetermined length along an insertion direction of the nozzle and providing a space in which the carbon nanotubes are synthesized from the carbon source supplied through the nozzle member; and
  a chamber formed to have a predetermined length outside the reaction tube and configured to supply heat to the reaction tube to form a reaction area within the reaction tube, and
 wherein the chamber comprises:
  a housing comprising a heat insulating material;
  a partition dividing an interior space of the housing into a plurality of spaces; and
  a heating member provided in the plurality of spaces and configured to apply heat to the reaction tube.

2. The apparatus of claim 1, wherein the supply unit comprises:
 a first supply pipe for supplying the carbon source;
 a second supply pipe for supplying a catalyst; and
 a third supply pipe for introducing a reaction gas, supplied from the first supply pipe and the second pipe, into the reaction unit.

3. The apparatus of claim 1, wherein the nozzle member is inserted into the reaction tube to a depth of 250 mm to 300 mm.

4. The apparatus of claim 1, wherein the nozzle member is inserted to a predetermined depth from one end of the reaction tube so that the end thereof is located in a space where a laminar flow is formed in the reaction tube.

5. The apparatus of claim 1, wherein the nozzle member has an inner diameter of 2 mm to 7 mm.

6. The apparatus of claim 1, wherein the nozzle member comprises an alumina tube.

7. The apparatus of claim 1, wherein a plurality of the nozzle members is inserted into the reaction tube.

8. The apparatus of claim 7, wherein the plurality of nozzle members is inserted by individually adjusting an insertion length of each of the nozzle members or a distance between an end of each of the nozzle members and the reaction area.

9. The apparatus of claim 1, wherein the reaction tube comprises a horizontal reaction tube.

10. The apparatus of claim 1, wherein the collection unit comprises a filter member connected to the reaction unit and configured to collect the synthesized carbon nanotubes discharged from the reaction unit while allowing unreacted material to pass therethrough.

11. An apparatus for producing carbon nanotubes comprising:
   a reaction unit in which carbon nanotubes (CNTs) are synthesized;
   a supply unit configured to supply a carbon source to the reaction unit through a supply pipe; and
   a collection unit configured to collect carbon nanotubes discharged from the reaction unit,
   wherein the reaction unit comprises a chemical vapor deposition reactor,
   wherein the reaction unit comprises:
   a nozzle member communicating with the supply pipe;
   a reaction tube, into one end of which the nozzle member is inserted, the reaction tube being formed to have a predetermined length along an insertion direction of the nozzle and providing a space in which the carbon nanotubes are synthesized from the carbon source supplied through the nozzle member; and
   a chamber formed to have a predetermined length outside the reaction tube and configured to supply heat to the reaction tube to form a reaction area within the reaction tube,
   wherein the reaction unit further comprises a cooling member provided outside one end of the reaction tube into which the nozzle member is inserted, the cooling member being configured to cool heat generated from the carbon source flowing through the nozzle member.

12. The apparatus of claim 11, wherein the reaction unit further comprises a heating tape provided between the cooling member and the chamber outside the reaction tube.

13. An apparatus for producing carbon nanotubes comprising:
   a reaction unit in which carbon nanotubes (CNTs) are synthesized;
   a supply unit configured to supply a carbon source to the reaction unit through a supply pipe; and
   a collection unit configured to collect carbon nanotubes discharged from the reaction unit,
   wherein the reaction unit comprises a chemical vapor deposition reactor,
   wherein the reaction unit comprises:
   a nozzle member communicating with the supply pipe;
   a reaction tube, into one end of which the nozzle member is inserted, the reaction tube being formed to have a predetermined length along an insertion direction of the nozzle and providing a space in which the carbon nanotubes are synthesized from the carbon source supplied through the nozzle member; and
   a chamber formed to have a predetermined length outside the reaction tube and configured to supply heat to the reaction tube to form a reaction area within the reaction tube, and
   wherein a distance between the end of the nozzle member that is inserted into the reaction tube and the reaction area is 30 mm to 80 mm.

14. The apparatus of claim 13, wherein the chamber comprises:
   a housing comprising a heat insulating material;
   a partition dividing an interior space of the housing into a plurality of spaces; and
   a heating member provided in the plurality of spaces and configured to apply heat to the reaction tube.

15. A method for producing carbon nanotubes using the apparatus of claim 13, the method comprising:
   supplying the carbon source to the reaction unit through the supply pipe;
   synthesizing the carbon nanotubes in the reaction unit; and
   collecting the carbon nanotubes discharged from the reaction unit in a collection unit.

16. A method for producing carbon nanotubes using the apparatus of claim 13, wherein a distance between the end of the nozzle member that is inserted into the reaction tube and the reaction area is 30 mm to 60 mm.

* * * * *